United States Patent [19]

Maiese et al.

[11] 4,224,663
[45] Sep. 23, 1980

[54] MOUNTING ASSEMBLY FOR SEMICONDUCTIVE CONTROLLED RECTIFIERS

[75] Inventors: John J. Maiese, Pittsburgh; Kenneth E. Opal, Oakmont, both of Pa.

[73] Assignee: Power Control Corporation, Pittsburgh, Pa.

[21] Appl. No.: 8,354

[22] Filed: Feb. 1, 1979

[51] Int. Cl.³ .............................................. H01L 23/40
[52] U.S. Cl. ..................................... 363/144; 361/388; 357/79; 357/81
[58] Field of Search ........................ 363/141, 144–146; 361/386, 388, 381; 357/79–81

[56] References Cited

U.S. PATENT DOCUMENTS

| 3,356,902 | 12/1967 | Blaikie | 361/388 |
|---|---|---|---|
| 3,688,159 | 8/1972 | Robbins | 361/386 |
| 3,955,122 | 5/1976 | Maynard et al. | 357/81 X |
| 4,126,883 | 11/1978 | Martin | 357/79 X |
| 4,128,870 | 12/1978 | Knobloch et al. | 363/144 X |
| 4,161,016 | 7/1979 | Born et al. | 363/141 X |

Primary Examiner—J. D. Miller
Assistant Examiner—Peter S. Wong
Attorney, Agent, or Firm—Thomas H. Murray

[57] ABSTRACT

A mounting assembly for press-pack semiconductive controlled rectifiers wherein the rectifiers are all thermally connected to the same heat sink using an insulating medium, the rectifiers being electrically interconnected using common bus bars as required to provide a desired alternating current or direct current connection. A common spring arrangement is used to apply appropriate pressure to at least two semiconductors at once to hold them in contact with their associated bus bars. At least one of the interconnecting bus bars for the rectifiers is formed of a malleable conducting medium, such as copper, formed and used in a manner to provide load equalizing and surface alignment such that the spring can transmit uniform pressure to the heat sink and the semiconductive controlled rectifiers.

13 Claims, 8 Drawing Figures

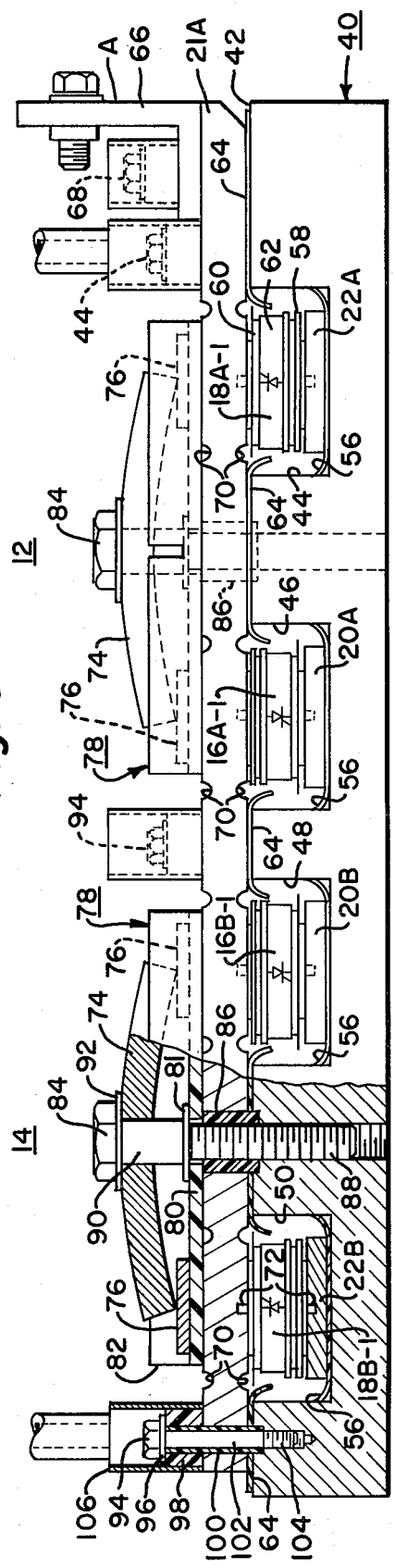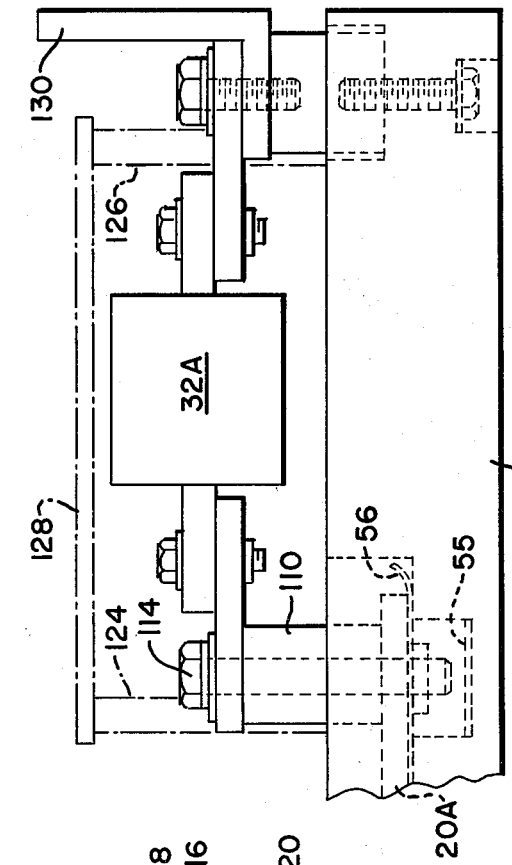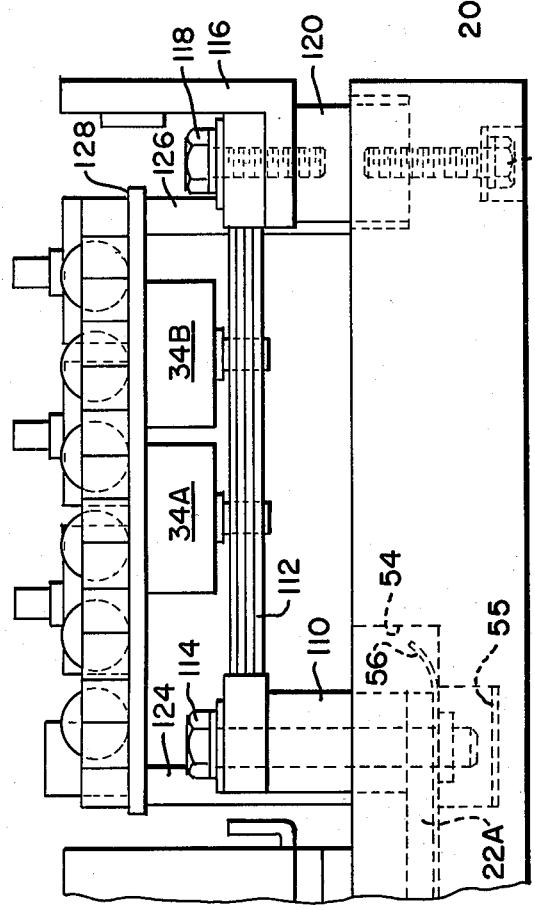

MOUNTING ASSEMBLY FOR SEMICONDUCTIVE CONTROLLED RECTIFIERS

BACKGROUND OF THE INVENTION

As is known, mounting assemblies for high-power semiconductive controlled rectifiers require the use of heat sinks to carry away the heat generated during the power conversion process. In the usual case, the heat sinks are finned and of relatively large size. Furthermore, prior art assemblies for semiconductive controlled rectifiers usually require at least two heat sinks on opposite sides of one or more semiconductors.

The present invention is particularly adapted for use with press-pack or disc-type semiconductive controlled rectifiers. As is known, such rectifiers consist of a flat semiconductor assembly sandwiched between thin circular sheets of electrical conducting material and surrounded by a ring-shaped ceramic insulator which is bonded to the two circular sheets to form a hermetic seal. The thin circular sheets of electrical conducting material comprise the anode and cathode, respectively, of the rectifier. When mounting press-pack semiconductive controlled rectifiers of this type on heat sinks, it is necessary to provide a specific value of compressive force between the rectifier and the heat sink over the complete contact surface on opposite sides of the disc-shaped rectifier to insure good heat transfer as well as a good electrical connection. It is also desirable to thermally connect heat sinks to both sides of the rectifier to carry away the heat generated in the power conversion process and to obtain maximum utilization of the device parameters.

Since the circular electrical sheets of conducting material on opposite sides of the rectifier, comprising the anode and cathode connections, are not ordinarily parallel, some means must be provided to allow for surface alignment. This has been achieved in the past by a number of different spring devices which must transmit the spring pressure to the rectifiers and clamp the same between the two heat sink surfaces. Generally, there is a separate spring for each rectifier, along with a pivot point element or bellows arranged for each rectifier-heat sink configuration. As a result, when several press-pack semiconductive rectifiers are interconnected to provide alternating current or direct current outputs, the mechanical construction, electrical insulation, spacing and interconnecting wires become very elaborate and bulky, the heat sinks usually comprising large finned radiators on opposite sides of the rectifiers as described above.

SUMMARY OF THE INVENTION

In accordance with the present invention, a new and improved semiconductor assembly for press-pack semiconductive controlled rectifiers is provided which is compact, which utilizes a common spring device for holding two rectifiers in place, and which utilizes a common heat sink for heat emanating from both sides of each rectifier. In this respect, the invention provides a simplified, easily manufactured assembly for disc-type semiconductive controlled rectifiers by combining the features of interconnection, pressure application, insulation, load alignment and load pressure equalization, together with double-sided cooling of the rectifiers.

In the preferred embodiments of the invention, the mounting assembly comprises a base block formed from material of high heat conductivity and having at least two depressed portions formed in the upper surface of the base block. In the usual case, the depressed portions are formed by milling parallel slots in the upper surface of the base block, but could also be formed by casting or assembling separate components. First and second generally parallel electrical bus bars are provided at the bottoms of the depressed portions or slots; while press-pack semiconductive controlled rectifiers are positioned on the first and second bus bars each with one terminal in electrical contact with an associated one of the first and second bus bars. A third bus bar extends across the upper surface of the base block in which the slots are formed, transversely of the first and second bus bars, and in electrical contact with the other terminals of each of the semiconductive controlled rectifiers. The first and second bus bars are electrically insulated from the bottoms of the slots and the third bus bar is electrically insulated from the upper surface of the base block in which the slots are formed by a thin-film insulating material which will permit heat to flow from the bus bars into the base block. Thus, heat from the bottoms of the rectifiers will flow into the base block through the first and second bus bars disposed within the aforesaid slots; while heat from the upper surface of the rectifiers will flow into the same base block through the third bus bar which overlies the upper surface of the base block. The assembly is completed by means, preferably a curved spring device, for exerting force on the third bus bar to hold both semiconductive controlled rectifiers in compression between the third bus bar and a respective one of the first and second bus bars in the aforesaid slots.

In the description given above, only two semiconductive controlled rectifiers are mentioned; however it will be appreciated that by spacing a plurality of rectifiers along each bus bar disposed within the slots in the base block, and by providing additional upper bus bars which engage the upper surfaces of pairs of semiconductive controlled rectifiers positioned on the lower bus bars, various arrangements including an AC-to-DC power bridge, a DC-to-DC power bridge or a DC-to-AC power bridge can be formed.

The above and other objects and features of the invention will become apparent from the following detailed description taken in connection with the accompanying drawings which form a part of this specification, and in which:

FIG. 3 is an end view of the apparatus shown in FIG. 2;

FIG. 4 is a side view taken substantially along line IV—IV of FIG. 2;

FIG. 5 is a cross-sectional view taken substantially along line V—V of FIG. 2;

Figure 1:
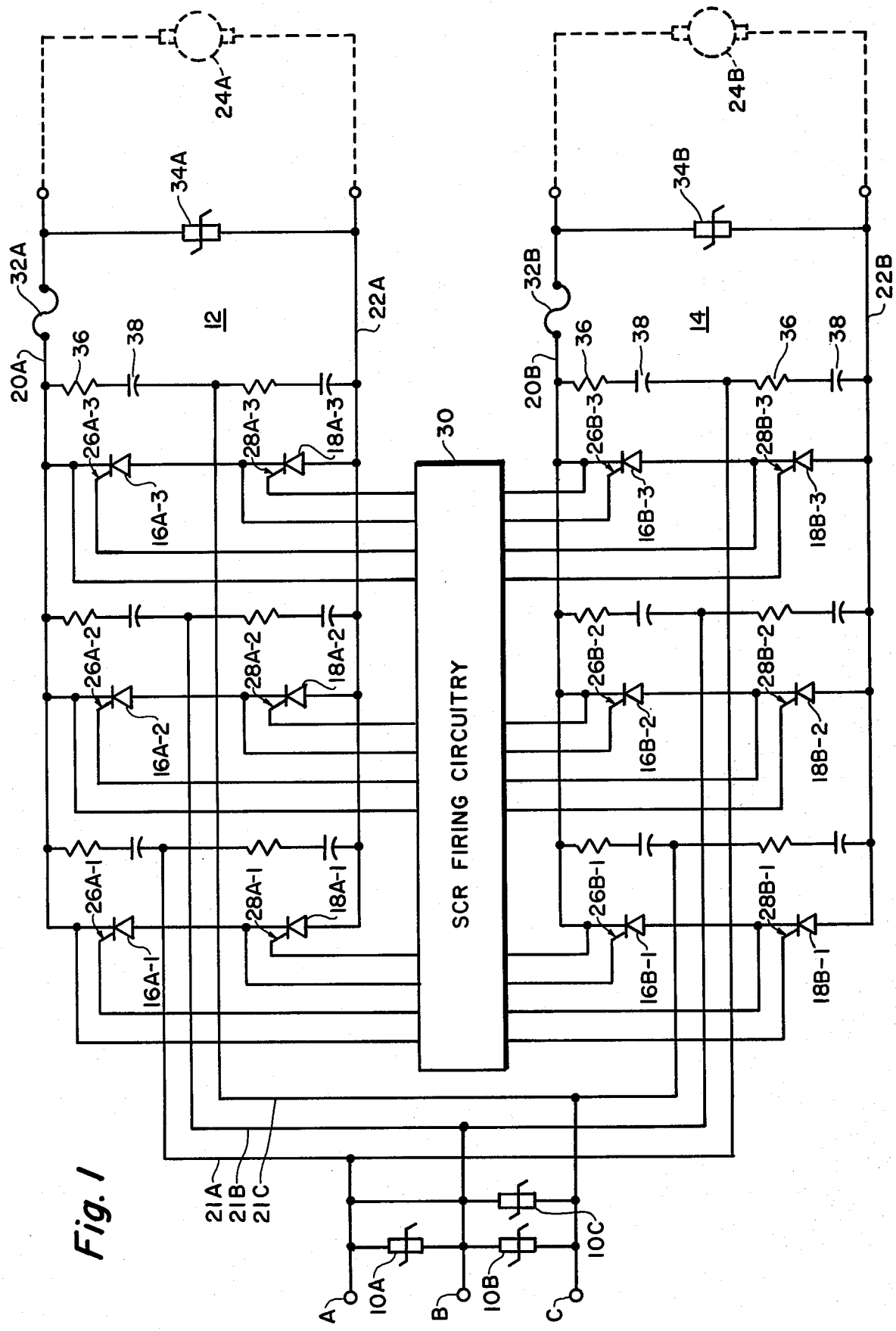
FIG. 1 is a schematic circuit diagram of a dual AC-to-DC converter which can be incorporated into the novel semiconductor assembly of the invention.

With reference now to the drawings, and particularly to FIG. 1, the schematic circuit diagram shown is typical of that for a conventional dual regenerative AC-to-DC converter and forms no part of the present invention. It is included herein only to facilitate an explanation of one embodiment of the semiconductive controlled rectifier package assembly of the invention.

In the converter of FIG. 1, three phases of an alternating current power source are applied to three input terminals A, B and C of the dual converter. Connected between each of the three phases are three metal oxide varistors 10A, 10B and 10C which act to shunt excessive voltage surges at the input.

The three input terminals, A, B and C are connected to two identical AC-to-DC converters 12 and 14 each of which is identical. The upper converter 12, for example, includes three upper semiconductive controlled rectifiers 16A-1, 16A-2 and 16A-3 and three lower controlled rectifiers 18A-1, 18A-2 and 18A-3. The cathodes of rectifiers 16A-1 through 16A-3 are connected to a first output power bus 20A; while the anodes of the rectifiers 18A-1 through 18A-3 are connected to a second output power bus 22A. The buses 20A and 22A, in turn, are connected to a direct current motor 24A or other similar direct current utilization device.

With the arrangement shown, the two output power buses 20A and 22A are interconnected by three current paths each including two semiconductive controlled rectifiers, with the junctions between the respective rectifiers in each current path being connected to one of the three input terminals A, B or C through conductors 21A, 21B and 21C.

As will be readily appreciated by those skilled in the art, the semiconductive controlled rectifiers are normally non-conducting; however the rectifiers 16A-1 through 16A-3, for example, can be triggered into conduction by application of positive firing pulses to their gate electrodes 26A-1, 26A-2 and 26A-3. The same is true of rectifiers 18A-1 through 18A-3. That is, they can be triggered into conduction by the application of positive gate pulses to their gate electrodes 28A-1, 28A-2 and 28A-3. The positive gate pulses applied to the control electrodes, in turn, are generated by means of firing circuitry, generally indicated by the reference numeral 30, which is common to both converters 12 and 14. Converter 14 is identical to converter 12 and is connected in parallel thereto. Elements in converter 14 corresponding to those of converter 12 are identified by like reference numerals except that the letter "B" is substituted for "A" in the elements of converter 14.

As was mentioned above, the normally non-conducting semiconductive controlled rectifiers can be triggered into conduction by application of positive firing pulses to their gate electrodes. Once the controlled rectifiers are triggered into conduction, the gate loses control; and the rectifiers can be turned OFF only by reducing the currents they carry to zero. In the converter shown, reduction in current to zero and turn-off of the rectifiers occur due to the sinusoidal nature of the applied voltage. By varying the phases of the positive firing pulses applied to the gate electrodes of the respective rectifiers, the periods of conduction of the controlled rectifiers and, hence the power supplied to the output buses 20A and 22A can be varied in accordance with well-known techniques. Output 20A includes a fuse 32A; and, similarly, output bus 20B includes a fuse 32B. Connected across the load of each converter is a metal oxide varistor 34A or 34B. In shunt with each of the controlled rectifiers is a resistor 36 in series with a capacitor 38, the capacitor 38 acting to protect the rectifiers and prevent an excessive rate of change of voltage with respect to time across each rectifier. Again, it will be appreciated that the circuitry of FIG. 1 is well known and is included in this description only to facilitate an understanding of the power pack assembly about to be described.

Figure 2:
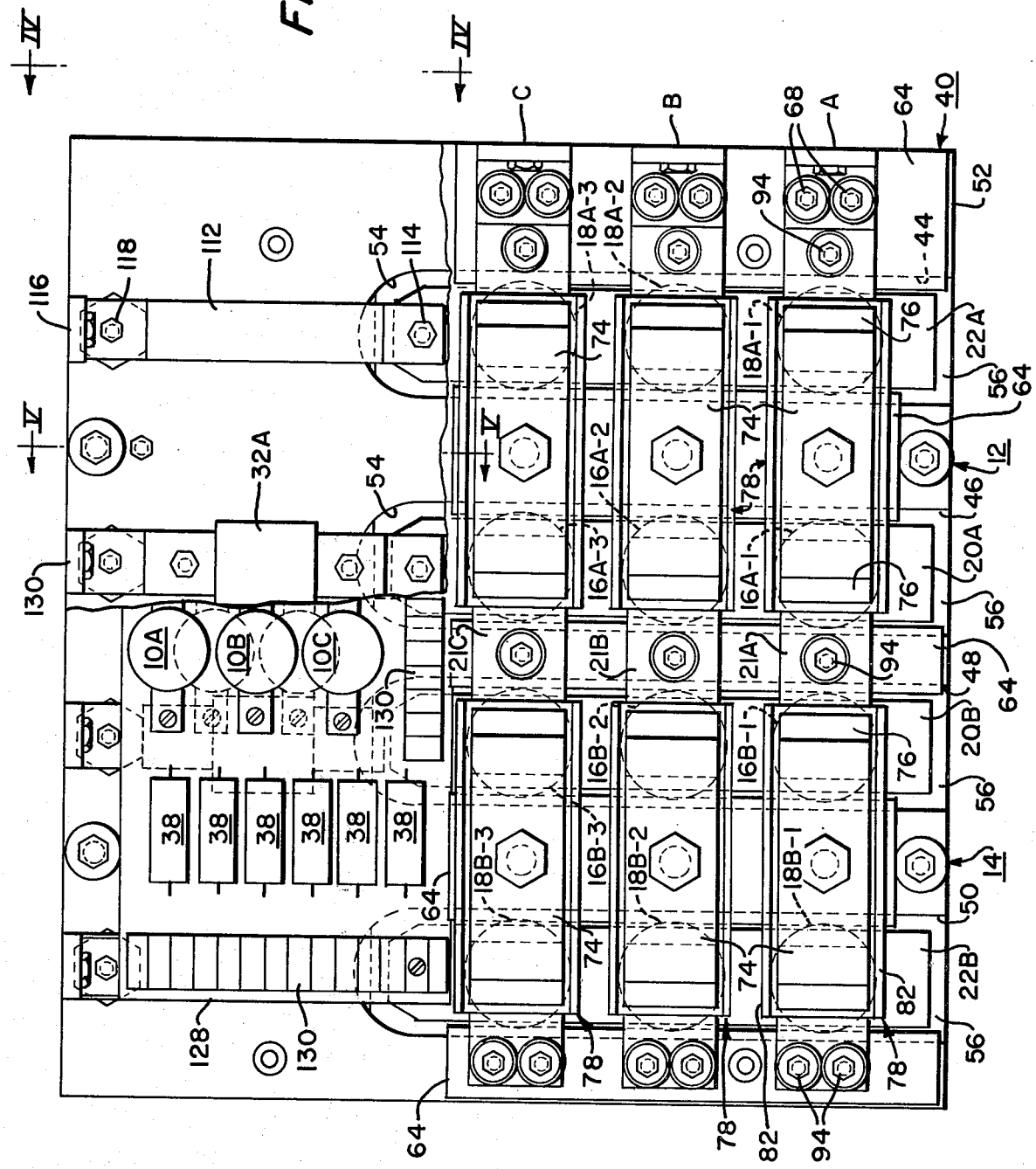
FIG. 2 is a top view of one embodiment of the invention as applied to the dual converter circuitry of FIG. 1.

The thyristor assembly itself is shown in FIGS. 2 and 3 and includes a lower base block 40 formed of aluminum or some other material of high heat conductivity. The specific embodiment of the invention shown in FIGS. 2 and 3 is for a dual converter, such as that schematically shown in FIG. 1, which includes twelve semiconductive controlled rectifiers which are numbered to conform to those shown in FIG. 1. Milled into the upper surface 42 of the block 40 are four slots (sometimes referred to in the following claims as "depressions"), these being identified by the numerals 44, 46, 48 and 50. Each of the slots 44-50 extends from an edge 52 of block 40 (the lower edge in FIG. 2) to a rounded portion 54. At the bottom of each of the slots 44-50 is a copper bus bar. These bus bars correspond to the output power leads shown in FIG. 1 and are identified by the same numerals 20A, 22A, 20B and 22B, respectively. Each of the four bus bars shown in FIG. 3, for example, is electrically insulated from the base block 40 by means of thin-film insulating material 56 which may, for example, comprise Kapton (Trademark) of a thickness of about 5 mils, which provides an insulator with excellent dielectric strength and high thermal conduction characteristics.

The semiconductive controlled rectifiers in FIGS. 2 and 3 are identified by the same numerals as those shown in FIG. 1. Spaced along bus bar 22A, for example, are the three rectifiers 18A-1, 18A-2 and 18A-3 (FIG. 2). As best shown in FIG. 3, the rectifier 18A-1, for example, includes a lower disc-shaped anode 58, an upper disc-shaped cathode 60 and a surrounding ceramic insulator 62 which houses the silicon semiconductive controlled rectifier itself. The rectifiers 16A-1, 16A-2 and 16A-3 (FIG. 2) are in contact with the bus bar 20A in slot 46; however, in this case, their cathodes are in contact with the bus bar 20A rather than their anodes as is the case with rectifiers 18A-1 through 18A-3 on bus bar 22A. The arrangement of the rectifiers on the other converter 14 is, of course, the same.

Upper distribution bus bars 21A, 21B and 21C (FIG. 2) overlie the upper surface 42 of the base block 40 and are insulated therefrom by thin-film insulators 64 formed from the same material as the insulator 56 between the bus bars 20A, 20B and 22A, 22B and the bottom of slots 44-50. With the arrangement shown, it will be appreciated that the bus bars within the slots 44-50 and the transverse bus bars 21A, 21B and 21C are electrically insulated from the base block 40. However, by virtue of the high thermal conductivity of the insulating material, heat can flow from either set of bus bars directly into the base block 40.

As best shown in FIG. 2, the input bus bars 21A, 21B and 21C extending across the upper surface 42 of the base block 40 are at right angles to the bus bars 20A, 20B and 22A, 22B within slots 44-50 and are connected at their right ends as shown in FIGS. 2 and 3 to the three-phase input terminals A, B and C. As best shown in FIG. 3, each input terminal comprises an angle 66 of electrical conducting material bolted to an associated one of the bus bars 21 by means of a bolt 68. Bolt 68 is insulated from the angle 66 and the bus bar 21A, for example, and is threaded into the lower base block 40 in a manner hereinafter described.

Each of the input bus bars 21, as best shown in FIG. 3, is provided with transverse notches 70 in its upper and lower surfaces on each side of an associated one of the rectifiers which it contacts. These notches permit deflection of the bus bar above the rectifiers to provide for tolerance differences between the rectifiers and the milled slots 44–50 and also to provide uniform spring pressure on the rectifiers in a manner hereinafter described.

As best shown in the left-hand, broken-away portion of FIG. 3, the disc-shaped anode and cathode of each semiconductive controlled rectifier is provided with a projecting pin 72 which fits into a cooperating hole in the bus bar above or below it. The pins 72 serve to locate the rectifiers for proper positioning and also serve as a means for locking the rectifier-bus bar structure from further movement.

The rectifier-bus bar assembly is held in place with force supplied by arcuate springs 74 perhaps best shown by the broken-away, left-hand portion of FIG. 3. There is an arcuate spring 74 for each adjacent pair of rectifiers on the bus bars 20 and 22 in each converter 12 or 14. Each spring 74 has an upper convex side and a lower concave side which terminates at ends which rest on stainless steel pressure pads 76 which distribute the force onto a generally U-shaped insulator 78. That is, each insulator 78 is provided with a lower planar portion 80 which abuts the upper surface of a transverse bus bar 21 and upstanding side walls 82 at its opposite edges.

Each arcuate spring member 74 is provided with a central opening or hole through which a bolt 84 passes. The bolt 84, as well as the spring member 74, are insulated from the bus bar 21A, for example, by means of the channel-shaped insulator 78 as well as by an insulating bushing 86 surrounding the bolt in the area of the bus bar. Bolt 84 is provided with a lower threaded portion 88 which threads into the base block 40. Above the threaded portion 88 is an enlarged diameter portion which terminates on washer 81 which abuts against the planar portion 80 of insulator 78. The enlarged diameter portion of bolt 84 along with washer 81 forms a convenient means for adjusting the pressure exerted by each of the arcuate spring members 74 as well as assuring pressure between transverse bus bar 21, film insulator 64 and base block 40. That is, the bolt 84 can be threaded into the base block 40 without any washers disposed between its head and upper convex surface of the spring member 74 until the bolt shoulder bottoms against washer 81 and insulator 78. At this point, a certain amount of clearance will exist between the lower side of the head of bolt 84 and the upper surface of the spring member 74. A sufficient number of washers 92 can then be selected to compensate for this clearance; and an additional number of washers 92 can be added to exert sufficient pressure on the spring members 74 to securely hold the bus bar 21A, for example, against the upper surfaces of the semiconductive controlled rectifiers 16 and 18 and the lower surfaces of the same rectifiers against the lower bus bars 20 and 22. While only one washer is shown in FIG. 3, it will be appreciated that in an actual installation, a number of washers are used. For example, if the bolt 84 is threaded into its bore in the base block 40 until the bolt shoulder bottoms against its associated washer-insulator, and if under these circumstances a spacing equal to the thickness of two washers exists between the lower surface of the bolthead and the upper surface of the spring members 74, then two washers plus an additional number of washers necessary to exert sufficient force on the pressure pad 76 can be inserted over the unthreaded portion of the bolt. The bolt is then threaded into its tapped hole until its shoulder abuts against its cooperating washer and insulator. In this way, it is known that sufficient pressure is exerted on the arcuate spring members 74, which are pre-sprung, to hold the semiconductive controlled rectifiers securely in place against the upper and lower transversely-extending bus bars. The bus bar 21, film insulator 64 and base block 40 are also in compression as determined by the torque applied to bolt 84 after the shoulder abuts on washer 81.

The opposite ends and the center of the bus bar 21A are securely held against the thin-film insulators 64 on the upper surface 42 of the base block 40 by means of bolts 94. Bolts 94 are secured in place in the same manner as bolts 68 previously described. The arrangement is shown in the left-hand broken-away portion of FIG. 3. Thus, the underside of the bolthead of bolt 94 is provided with a Bellville washer 96 which abuts against an annular insulating spacer 98. Extending through the spacer 98 is a tubular insulating member 100 which surrounds the shank 102 of the bolt 94 and thus insulates it from the bus bar 21A. The lower end 104 of the bolt 94 is threaded into a tapped bore in the base block 40. Surrounding the spacer 98 and projecting above the head of bolt 94 is an annular insulator 106 which precludes the possibility of arcing between the head of the bolt and the bur bar 21A, for example. All bolts holding elements on the block 40 are essentially the same.

As is shown in FIGS. 2 and 4, the bus bar 22A, for example, terminates at the rounded end portion 54 of the slot 44 and is connected via conductive spacer 110 to an output bus bar 112, the bus bar 22A, the bus bar 112 and the spacer 110 being held in an assembled position by means of bolt 114. Lower end of bolt 114 is electrically insulated from slot 44 bottom by a circular insulator 55 from the same material as insulator 56. The other end of the bus bar 112, in turn, is connected to an output terminal 116 which, in the illustrative embodiment of the invention shown, is in the form of an angle. A bolt 118 holds the bus bar 112 and the angle output terminal 116 in place and via a tapped insulating spacer 120 the insulated spacer 120 is held firm to block 40 by bolt 122. Insulated spacers 124 and 126 project upwardly from the base block and carry, at their upper extremities, a circuit board 128 which supports various circuit components shown in FIG. 1. Thus, projecting from beneath the circuit board 128 are the two output metal oxide varistors 34A and 34B, each being connected across a cooperating pair of output buses 20 and 22. Carried on top of the circuit board 128 are the capacitors 38, resistors 36, not shown, as well as the input metal oxide varistors 10A, 10B and 10C. Terminal blocks 130 are provided for making connections to the various circuit components shown.

In FIG. 5, the connection between the end of output bus 20A and its output terminal 130 is shown. The arrangement is similar to that of FIG. 4 except that the fuse 32A is connected between the terminal 130 and the bushing 110 held in place by bolt 114.

With the arrangement shown, it will be appreciated that a very compact assembly is provided in which heat from both sides of each of the semiconductive controlled rectifiers 16 and 18 is conducted to the heat sink base block 40. If necessary or desirable, fins can be connected to the base block 40 to permit cooling by air currents or passageways can be provided in the base block itself to permit passage of a cooling fluid therethrough. Instead of utilizing a single spring assembly for each of the semiconductive controlled rectifiers as in prior art systems, a single spanning spring member 74 is used for adjacent semiconductive controlled rectifiers and affords a means for securely holding the rectifiers in good thermal and electrical contact with associated upper and lower bus bars. If it is desired to form a single AC-to-DC converter, only the left-hand or right-hand portion of the system shown in FIGS. 2 and 3 will, of course, be used.

Figure 6:
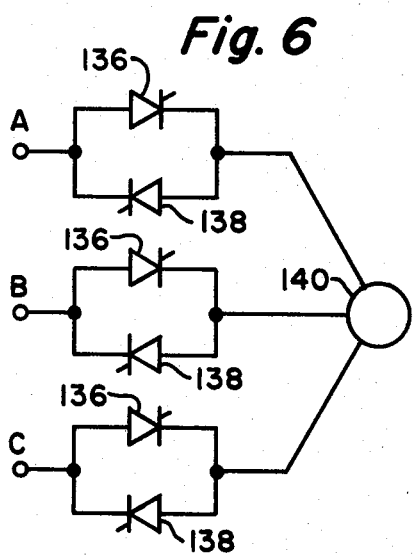
FIG. 6 is a schematic illustration of an AC-to-AC converter which can be constructed in accordance with the principles of the invention.
Figure 7:
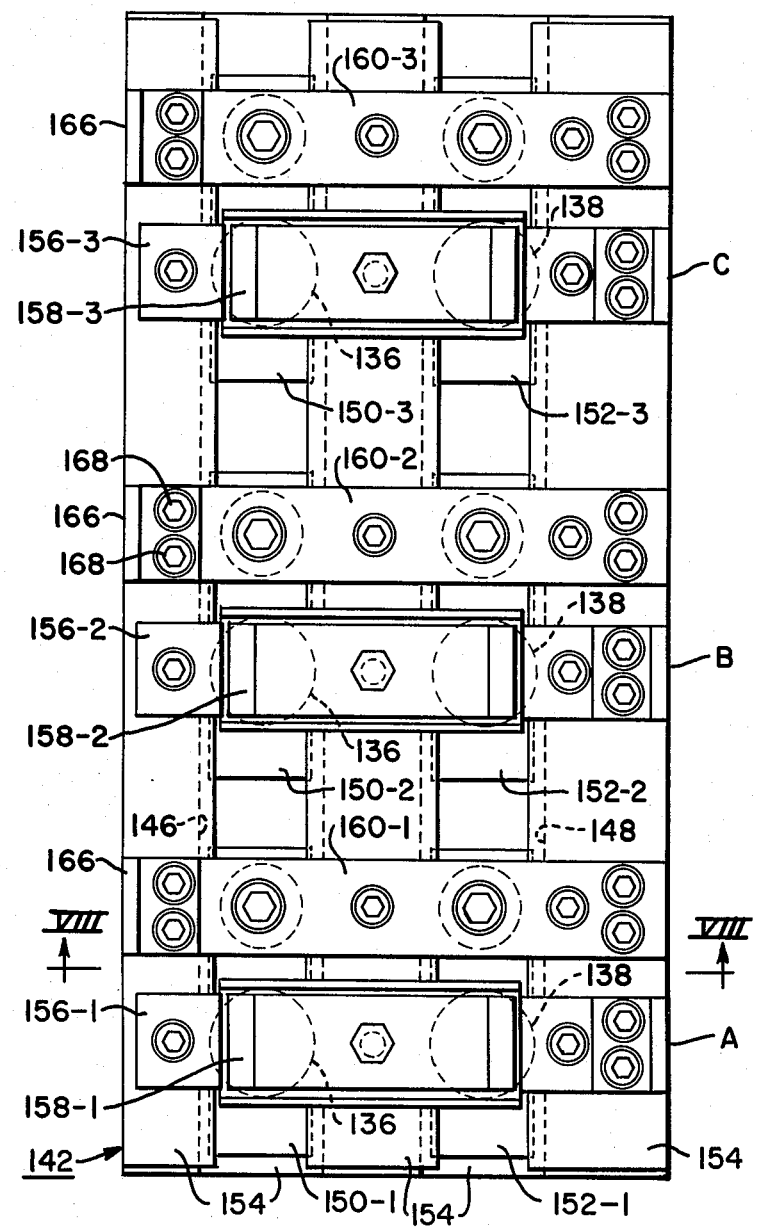
FIG. 7 is a top view, similar to FIG. 1, of an AC-to-AC converter utilizing the principles of the invention.
Figure 8:
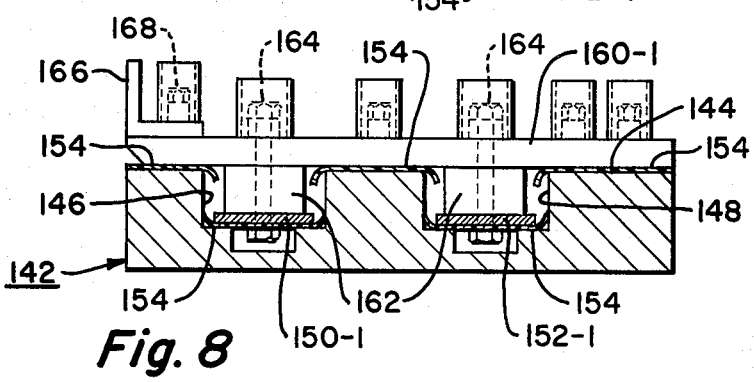
FIG. 8 is a cross-sectional view taken substantially along line VIII—VIII of FIG. 7.

It is also possible to provide an AC-to-AC converter utilizing the principles of the invention or to provide other converter or inverter configurations. An AC-to-AC configuration is schematically illustrated in FIG. 6. In an arrangement of this type, and as shown in FIGS. 7 and 8, each of the input terminals A, B and C of a three-phase power source is connected through parallel, reverse polarity semiconductive controlled rectifiers 136 and 138 to an alternating current load such as a synchronous motor 140. With an arrangement of this type, the sinusoidal waveform of each of the three input phases can be pulse-width modulated by applying firing pulses to the respective semiconductive controlled rectifiers to thereby vary the power supplied to the load 140 in accordance with well-known techniques. The firing circuitry, of course, is not shown in FIG. 6.

An arrangement incorporating the principles of the present invention for mounting semiconductive controlled rectifiers in an alternating current-to-alternating current converter is shown in FIGS. 7 and 8. In this case, a heat sink base block 142 is again employed. As in the embodiment of FIG. 2, the elongated depressions or slots 146 and 148 are milled in the upper surface 144 of the base block 142. However, in this case, continuous bus bars do not extend along the bottoms of the slots 146 and 148. Rather, there are three sets of bus bars in each slot, these being identified as 150-1, 150-2 and 150-3 in slot 146 and as 152-1, 152-2 and 152-3 in slot 148. Again, the respective bus bars are insulated from the base block 142 by means of thin-film insulating material identified by the reference numeral 154 in FIG. 8. Bus bars 156-1, 156-2 and 156-3 (FIG. 7) may extend across the upper surface 144 and are insulated therefrom by a thin-film insulating material. Additionally, arcuate clamps 158-1, 158-2 and 158-3 extend between semiconductors deposed on the respective lower bus bars 150 and 152 to hold them in place. The clamps 158-1 through 158-3, as mentioned above, are identical in construction to those shown in FIGS. 2 and 3 and include suitable insulators and pressure pads as shown in those figures. Beneath the upper bus bars 156 are the pairs of semiconductive controlled rectifiers 136 and 138 also illustrated in FIG. 6.

In this case, instead of connecting the bus bars in each slot to a common output bus, the respective, separated bus bars in the embodiment of FIG. 7 for each pair of semiconductive controlled rectifiers are each connected to a common output bus, these being identified by the reference numerals 160-1, 160-2 and 160-3 in FIG. 7. The details of the output bus bar 160-1, for examle, are shown in FIG. 8. The bus bar 160-1 overlies the ends of the bus bars 150-1 and 152-1 in the slots 146 and 148 and is connected thereto by means of conducting spacers 162. The upper bus bar 160-1 is held in contact with the spacers 162 which, in turn, are held in contact with the lower bus bars 150-1 and 152-1 by means of bolts 164 which go through bus bar 150-1, 152-1 and spacer 162 and held firm by a nut as previously described for bolt 114 in FIG. 4. Output terminals 166, in the form of angles, are also secured to the base block 142 by means of insulated bolts 168.

With the arrangement shown, the system of FIG. 7 effects the circuit arrangement of FIG. 6 such that an AC-to-AC converter can be provided which, at the same time, conducts heat from both sides of each semiconductive controlled rectifier to the base block 142 which, again, can be provided with cooling fins or other cooling passageways if desired or necessary.

Although the invention has been shown in connection with certain specific embodiments, it will be readily apparent to those skilled in the art that various changes in form and arrangement of parts may be made to suit requirements without departing from the spirit and scope of the invention. In this respect, it will be apparent that instead of milling slots 44–50 in the base block 40, the same overall effect can be achieved by securing spaced strips or blocks to a base block, just so long as depressions are formed for the rectifiers.

We claim as our invention:

1. A mounting assembly for a press-pack semiconductive controlled rectifier comprising base block means formed from material of high heat conductivity, a depressed portion formed in a surface of said base block means, a first electrical bus bar at the bottom of said depressed portion, a press-pack semiconductive controlled rectifier positioned on said first bus bar with one terminal in electrical contact with said first bus bar, a second bus bar extending across said surface of the base block and in electrical contact with the other terminal of the semiconductive controlled rectifier, and insulating material between said bus bars and said base block means, said insulating material permitting heat to flow from both bus bars into the base block means which acts as a common heat sink to dissipate heat from both bus bars.

2. The assembly of claim 1 including means for exerting force on said second bus bar to hold said semiconductive controlled rectifier in compression between said first and second bus bars.

3. A mounting assembly for press-pack semiconductive controlled rectifiers comprising a base block formed from material of high heat conductivity, at least two depressed portions formed in the surface of said base block, first and second generally parallel electrical bus bars at the bottoms of said depressed portions, press pack semiconductive controlled rectifiers positioned on said first and second bus bars each with one terminal in electrical contact with an associated one of said first and second bus bars, a third bus bar extending across said surface of the base block transversely of said first and second bus bars and in electrical contact with the other terminals of each of the semiconductive controlled rectifiers, said first and second bus bars being electrically insulated from the bottoms of said depressed portions and said third bus bar being electrically insulated from said surface of the base block in which said depressions are formed by thin-film insulating material which will permit heat to flow from the bus bars into the base block, and means for exerting force on said third bus bar to hold the semiconductive controlled rectifiers in compression between the third bus bar and a respective one of said first and second bus bars.

4. The assembly of claim 3 wherein the means for exerting force on said third bus bar comprises an element which spans the distance between said semiconductive controlled rectifiers and has opposite ends which overlie the central portions of the semiconductive controlled rectifiers, and bolt means passing through an opening in the element substantially intermediate its said opposite ends and threaded into said base block means for drawing the said ends of the element toward the base block means, whereby pressure will be exerted by said opposite ends of the element on said third bus bar and said semiconductive controlled rectifiers to hold them between the third and a respective one of the first and second bus bars.

5. The assembly of claim 4 wherein said element comprises a spring member having an upper concave side and a lower convex side, the ends of said lower convex side exerting pressure on said third bus bar.

6. The assembly of claim 5 including an insulator disposed between said opposite ends of said element and said third bus bar.

7. The assembly of claim 6 including metallic pressure pads disposed between the opposite ends of said element and said insulator.

8. The assembly of claim 4 including insulating means between said bolt means and said third bus bar.

9. The assembly of claim 4 including notches extending transversely of said third bus bar on each side of a respective one of said semiconductive controlled rectifiers.

10. The assembly of claim 3 wherein said depressed portions comprise slots milled in, cast in, or assembled on an integral base block.

11. The assembly of claim 3 wherein there are six semiconductive controlled rectifiers, three of said rectifiers being spaced along and having one terminal in contact with said first bus bar in one of said depressed portions, another three of said rectifiers being spaced along and having one terminal in contact with said second bus bar in the other of said depressions, and three bus bars extending generally perpendicular to said first and second bus bars across said surface of the base block, each of said three bus bars being in contact with the other terminals of one of the three semiconductive controlled rectifiers in each of the depressed portions, whereby power from the three phases of a three-phase alternating current source applied to said three bus bars extending across said surface will be converted to direct current power appearing across said first and second bus bars.

12. The assembly of claim 11 wherein said first and second depressed portions comprise parallel slots formed in said surface of the base block and said three bus bars extending across the surface of the base block are parallel to each other.

13. The assembly of claim 3 wherein said depressed portions are generally parallel and there are six semiconductive controlled rectifiers, three of said rectifiers being spaced along and having one terminal in contact with an associated one of three lower bus bars in one of said depressed portions, another three of said rectifiers being spaced along and having one terminal in contact with an associated one of three lower bus bars in the other depressed portions, the three bus bars in the respective depressed portions being electrically insulated one from the other, three upper bus bars extending generally perpendicular to said depressed portions across said surface of the base block in which said depressions are formed, each of said three upper bus bars being in contact with the other terminal of an associated one of the three semiconductive controlled rectifiers in each of the respective parallel depressed portions, and three output bus bars interconnecting the lower bus bars of the semiconductive controlled rectifiers which are commonly connected to an associated one of each of the three upper bus bars.

* * * * *